United States Patent [19]
Wadley et al.

[11] Patent Number: 5,736,073
[45] Date of Patent: Apr. 7, 1998

[54] PRODUCTION OF NANOMETER PARTICLES BY DIRECTED VAPOR DEPOSITION OF ELECTRON BEAM EVAPORANT

[75] Inventors: Haydn N. G. Wadley, Keswick; James F. Groves, Charlottesville, both of Va.

[73] Assignee: University of Virginia Patent Foundation, Charlottesville, Va.

[21] Appl. No.: 679,435

[22] Filed: Jul. 8, 1996

[51] Int. Cl.$^6$ .................................................. B29C 9/00
[52] U.S. Cl. ........................... 264/10; 264/5; 425/6
[58] Field of Search ................... 264/10, 5; 425/6

[56] References Cited

U.S. PATENT DOCUMENTS

| | | | |
|---|---|---|---|
| 4,642,207 | 2/1987 | Uda et al. | 264/10 |
| 4,732,369 | 3/1988 | Araya et al. | 264/10 |
| 5,344,676 | 9/1994 | Kim et al. | 264/10 |
| 5,472,749 | 12/1995 | Dravid et al. | 264/10 |
| 5,534,314 | 7/1996 | Wadley et al. | |
| 5,618,475 | 4/1997 | Johnson et al. | 264/10 |

*Primary Examiner*—Mary Lynn Theisen
*Attorney, Agent, or Firm*—Oblon, Spivak, McClelland, Maier & Neustadt, P.C.

[57] ABSTRACT

A process for vapor depositing an evaporant onto a substrate is provided which involves:

presenting the substrate to a deposition chamber, wherein the deposition chamber has an operating pressure of from 0.001 Torr to atmospheric pressure and has coupled thereto a carrier gas stream generator and an electron beam gun capable of providing an electron beam at the operating pressure and contains an evaporant source;

impinging the evaporant source with the electron beam to generate the evaporant;

entraining the evaporant in the carrier gas stream; and coating the substrate with the carrier gas stream which contains the entrained evaporant, and an apparatus for performing the process.

30 Claims, 6 Drawing Sheets

PRODUCTION OF NANOMETER PARTICLES BY DIRECTED VAPOR DEPOSITION OF ELECTRON BEAM EVAPORANT

This invention was made with government support under the NASA/ARPA Grant No. HQN-11, 156-ICU awarded by the National Aeronautics and Space Administration. The government has certain rights in the invention.

BACKGROUND OF THE INVENTION

1. Field of the Invention

The present invention relates to a process for the directed vapor deposition of an electron beam evaporant, its use in the preparation of nanometer sized particles and an apparatus for performing the process.

2. Discussion of the Background

The recent emergence of vapor phase processing technology has led to an atom by atom capability for producing coatings and engineered lamellar materials (already widely practiced in molecular beam epitaxy (MBE) for semiconductor heterostructures and for the production of $Al/Al_2 O_3$ laminates). Today, the most widely used vapor phase processing technologies are physical vapor deposition (e.g., sputtering, traditional electron-beam evaporation, ion deposition, effusion cells) and chemical vapor deposition (e.g., metal organic, plasma assisted). As noted in the table below, both of these approaches, while useful, have significant drawbacks which prevent or inhibit their use for processing many industrially important materials into desired thin and thick films.

| Advantages | Problems |
| --- | --- |
| Chemical Vapor Deposition (CVD) | |
| High throwing power (i.e., not line of site) | Expensive precursor gases |
| Many metals, semiconductors and ceramics | High temperature needs |
| Uniform deposits | Low deposition rates |
| Controllable microstructure | Inefficient materials utilization |
| | Not all material systems |
| | Complex equipment for multilayers |
| | Environmental impact |
| | Residual (deposition) stress |
| Physical Vapor Deposition (PVD) | |
| All metals and ceramics | Expensive equipment |
| Controllable microstructure | Low deposition rates (10 μm/h) |
| | Inefficient materials utilization (1–25%) |
| | High vacuum ($10^{-7}$ Torr) needed |
| | Line of site deposition |
| | Residual (deposition) stress |
| | Porosity |
| | Batch process |

Conventional CVD and PVD have numerous limitations. CVD often requires high temperatures to facilitate gas reactions while being able to deposit materials only slowly and inefficiently. Similarly, PVD processing requires expensive equipment and high vacuum facilities while only being capable of relatively low deposition rates, inefficient materials utilization, and line of site deposition. Traditional electron beam evaporation technology (a type of PVD) has been utilized for materials processing only in high vacuums, precluding its use with a stream of gas to focus and direct the evaporant for efficient materials deposition at extremely high rates. (Within the context of the present application the term "high vacuum" is equivalent to extremely low pressure, such as $10^{-6}$ Torr, while "low vacuum" is equivalent to higher pressures from 0.001 Torr up to but not including atmospheric pressure).

JVD (jet vapor deposition, U.S. Pat. No. 4,788,082), a process which utilizes a stream of gas to direct evaporant material to a substrate, has also fallen victim to similar limitations as CVD and JVD. The JVD process has always created its vapor inside of a jet forming conduit and then directed the gas and evaporant out through a nozzle and onto a substrate. Evaporating inside the gas flow tube is likely to lead to clogging of the nozzle even after short operation times. The inventor of JVD only envisioned making use of fairly rudimentary evaporation techniques such as resistive heating which are incapable of evaporating important refractory elements and compounds, can operate only at low rates (relative to e-beam evaporation), and are likely to contaminate the deposited material as the tungsten filament or its protective sheathing evaporates with the evaporant source material.

The inventor of JVD envisioned using only fairly small nozzles of an exit diameter "from several mm to 2 cm" ("Handbook of Deposition Technologies for Films and Coatings", 2nd ed., Ed. R. F. Bunshah, Noyes Publications, p. 823, 1994). These relatively small nozzles limit the volume of evaporant which may be passed through the nozzle per unit time without the formation of clusters via 3 body collisions. Clusters are groups of atoms which have joined together while in the carrier gas flow. In the Handbook of Deposition Technologies for Films and Coatings the inventor of JVD shows the dependence of clustering upon metal vapor concentration:

$$\pi_{3B} = 10^{32}/(M)(He)(sec)$$

where M and He are the relative concentrations of metal vapor and carrier gas. As the concentration of metal vapor increases the time necessary for cluster formation decreases. While this simple formula provides a general relation between cluster formation rate and metal vapor concentration it neglects the temperature dependence of the phenomenon as noted by Mikami. ("Transport Phenomena in Free-Jet Expansions", H. Mikami, in Bulletin of the Research Laboratory for Nuclear Reactors, vol. 7, p. 169, 1982). Research (D. Hill, Masters Thesis, University of Virginia, p. 59, 1994) has shown this critical temperature dependence makes cluster formation extremely likely using current JVD technology at or near room temperature. Research results presented by Hill indicate that under low Mach flow regimes, as many as 15–20% of all metal atoms can be involved in clustering during deposition at or near room temperature. When these atom clusters are deposited on the substrate they inhibit atomic motion vital to the formation of fully-dense and crystalline deposits which are almost always the preferred end product. To avoid clustering in these conventional JVD systems, evaporation rates must be lowered.

For over thirty years electron beam guns (e-guns) have been recognized and used as superior evaporation tools for producing material vapor streams of new and unusual substances (especially of refractory metals) for deposition upon various substrates. Advantages of electron beam (e-beam) evaporation include high evaporation rates, freedom from contamination, precise beam (power and position) control, excellent economy, and high thermal efficiency. The high evaporation rate and thermal efficiency of e-beam systems are related to the ability of e-guns to bring the heating source (electrons) directly into contact with the vapor emitting surface where beam controls allow precise evaporation rate control. With an e-beam source, the directly heated vapor-emitting surface has the highest temperature of the evaporating assembly, allowing the evaporation of materials from water-cooled crucibles, a near necessity for evaporating reactive, and highly reactive refractory materials. Importantly, the use of the e-beam source with a water-cooled crucible allows "skull" melting/evaporation which prevents crucible wall materials and related reaction products from entering the vapor stream.

Crucibleless (levitation) methods are also available for contaminant-free evaporation. Currently, such levitation methods are used to melt (alloy) small quantities of reactive metal alloys in laboratory environments. They are also used in the aluminum industry to continuously cast metals. In all other heating modes the energy flow goes through the crucible (or resistance-heated wire), then the molten evaporant, and finally to the vapor emitting surface, allowing for significant thermal losses and contamination.

E-beam sources can be used to evaporate many different forms of material, whilst feeding, filling, and changing from one evaporant to another can be easy and continuous. Pure elements, compounds, alloys, and mutually insoluble materials—virtually the entire periodic table of elements in all possible combinations—can be processed by e-beam evaporation. Low vapor pressure elements, such as molybdenum, tungsten, and carbon, are readily evaporated, as are the most reactive elements—titanium, niobium, and tantalum. Even alloys containing materials with significantly varying vapor pressures can sometimes be evaporated successfully. For example, it has been shown by others that seemingly difficult to process Ti alloys (such as those containing vanadium) having elemental vapor pressure ratios as high as 1000:1 can be deposited with the starting alloy's elemental ratios. However, elemental segregation continues to be a problem when working with certain material systems, e.g. Nb—Ti.

Traditionally, e-beam evaporation has been conducted in high vacuum systems ($<10^{-6}$ Torr), allowing free propagation of both the electron beam and the vapor stream. The resulting "unfocused" evaporation has always resulted in the waste of significant amounts of "expensive to produce" source material. While the desired substrate may be an array of 150μm diameter fibers, the vapor from a traditional e-beam source leaves the feed stock with a density distribution often described by a $\cos^n\theta$ function (where $n=1, 2, 3,$ or more) which results in coating nonuniformity for large area arrays and poor materials utilization with fibers arrayed only in the region of roughly uniform flux.

Directed vapor deposition has been employed by others, but only with the use of extremely high temperatures and with vapor phase processing methods other than electron beam (see Kalbskopf et al, U.S. Pat. No. 4,351,267; Ahmed, U.S. Pat. No. 4,468,283; and Schmitt, U.S. Pat. No. 4,788,082). Kalbskopf et al, U.S. Pat. No. 4,351,267, disclose an apparatus for depositing a layer of a solid material on a heated substrate. Their process uses a directed vapor deposition process using multiple vapor curtains which converge on the surface of the substrate. The coating substrate is provided by reactions of the gaseous reactants contained individually in each of the vapor curtains, which when converged, react to form the coating material. Ahmed, U.S. Pat. No. 4,468,283 discloses a method for directed CVD which requires collecting and recycling of the vapor stream in order to improve efficiency. Further, as was done by Kalbskopf et al above, Ahmed uses reactant gases which when in contact with one another, react to provide the coating material.

Schmitt, U.S. Pat. No. 4,788,082, discloses a method for vapor depositing using jet stream entrainment in which the depositing material vapor is generated by resistive heating, contact with a heated surface, or by use of a laser. The resulting vapor is contained within the gas jet nozzle, entrained in the carrier gas stream, and then passed through the jet nozzle into the deposition chamber. However, as noted previously, such generation of the depositing material vapor inside the gas jet may cause severe problems with nozzle clogging. Additionally, the Schmitt process can only work with a limited range of elements, at low rates, and most often with fine wire sources.

While CVD and PVD are capable of producing many industrially important materials, sizeable obstacles must be overcome if they are to yield materials that are cost effective solutions to the design engineer's material selection problems. In the case of CVD, very significant costs are associated with the precursor gases and their inefficient deposition. In the case of PVD, inefficient materials utilization and the need for high vacuum are significant cost factors.

To expand the viable applicability of such vapor phase processing technologies, processes are needed which are:

1. Capable of high deposition rates (>100 μm/min over 100's of square centimeters, i.e. grams/min.)
2. Controllable (well defined layer compositions, distinct interfaces, and microstructure)
3. Efficient (near 100%) in materials utilization
4. Flexible (allowing film layer thickness modulation, volume fraction variation, and many materials systems to be codeposited, i.e., to allow alloying and functional grading)
5. Able to produce near net shapes (to achieve economies by combining process steps)
6. Not capital equipment intensive
7. Not operator intensive (continuous, automated and reliable)

In addition to the coating of materials by vapor deposition as described above, there is also a need in the art for a process to produce nanometer (nm) powders, customarily defined as powders having particle sizes below 100 nm. Nanometer powders of semiconductors, carbon, metals, metal alloys and metal oxides have found application in a range of commercial products. Unfortunately, they have not been available in significant quantity due to difficulty in their preparation, resulting in a lack of high quality nanometer powders at a reasonable cost.

SUMMARY OF THE INVENTION

Accordingly, one object of the present invention is to provide a process for the production of nanometer particles that is capable of producing high quality powders efficiently and at a low cost.

Another object of the present invention is to provide a process for directed vapor deposition using an electron beam evaporant which makes efficient use of evaporant source materials and provides rapid deposition.

A further object of the present invention is to provide a process for directed vapor deposition which uses an electron beam evaporant and has high flexibility in its use by allowing film layer thickness modulation, volume fraction variation, and functional grading in a co-deposition system.

Another object of the present invention is to provide a process for directed vapor deposition of an electron beam evaporant which is continuous, automated, reliable and neither operator nor capital equipment intensive.

A further object of the present invention is to provide a process for directed vapor deposition of an electron beam evaporant which operates at low vacuum conditions.

A further object of the present invention is to provide a process for directed vapor deposition of an electron beam evaporant which is capable of producing near net shapes, thus achieving economies by combining process steps.

A further object of the present invention is to provide a process for directed vapor deposition of an electron beam evaporant which provides sufficient control to give well defined layer compositions, distinct interfaces, residual stress control, and microstructure control.

A further object of the present invention is to provide a process capable of continuous, directed deposition over a large area at a high rate, without clustering.

A further object of the present invention is to provide a process capable of utilizing a bias voltage to obtain ion assisted directed vapor deposition (IADVD).

A further object of the present invention is to provide an apparatus to perform directed vapor deposition of an electron beam evaporant which uses an electron beam gun capable of providing an e-beam at low vacuum conditions.

These and other objects of the present invention have been satisfied by the discovery of a process for directed vapor deposition of an electron beam evaporant, optionally onto a substrate, comprising:

providing a deposition chamber, wherein said deposition chamber has an operating pressure of from 0.001 Torr to atmospheric pressure and has coupled thereto a means for providing a carrier gas stream and a means for providing an electron beam at said operating pressure and contains an evaporant source, and optionally contains a substrate;

impinging said evaporant source with said electron beam to generate said evaporant; and either:

(a) entraining said evaporant in said carrier gas stream at a concentration sufficient to create nanometer particles of said evaporant; and collecting said particles, or (b) coating said substrate with said carrier gas stream which contains said entrained evaporant.

DESCRIPTION OF THE FIGURES

A more complete appreciation of the present invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
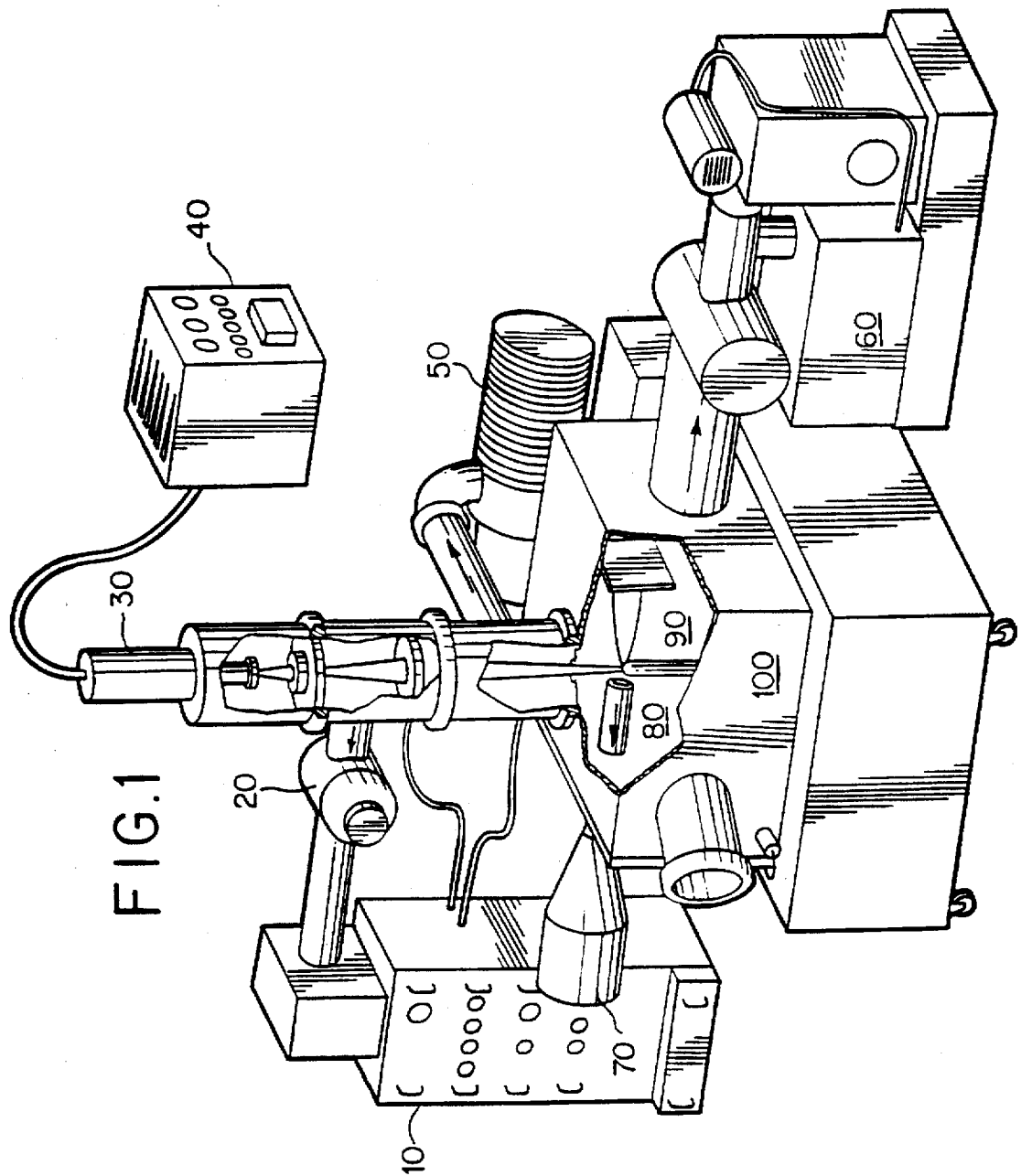
FIG. 1 is a schematic representation of an apparatus used to perform the present process.

The present invention relates to a process for vapor deposition of an evaporant onto a substrate comprising:

presenting the substrate to a deposition chamber, wherein said deposition chamber has an operating pressure of from 0.001 Torr to atmospheric pressure and has coupled thereto a means for providing a carrier gas stream and a means for providing an electron beam at said operating pressure and contains an evaporant source;

impinging said evaporant source with said electron beam to generate said evaporant;

entraining said evaporant in said carrier gas stream; and coating said substrate with said carrier gas stream which contains said entrained evaporant.

In particular, the present invention makes possible the creation of thin and thick films of any element or combination of elements at lower vacuum than previously possible by traditional electron beam evaporation. It also makes possible the creation of films from elements or combinations of elements which current low vacuum vapor deposition techniques are incapable of processing because of their inability to sufficiently heat the material source for rapid evaporation.

By combining e-beam evaporation in a partial inert gas pressure (low vacuum =1–10 Torr) with a purified direct gas flow, it is possible to use the valuable source materials much more efficiently and to deposit materials much more rapidly than is currently feasible via either traditional e-beam evaporation or other low vacuum vapor deposition systems. Instead of line-of-sight deposition, uniform, directed deposition on any desired substrate in any position is possible.

By operating an electron beam system at low vacuum in accordance with the present invention, a processing capability far superior to any other currently in existence has been achieved. The process of the present invention can evaporate and deposit reactive materials, (e.g., oxides, nitrides, and carbides) at high rates, simultaneously deposit different elements in precise elemental ratios for alloying purposes, and alternate between alloys for the production of microlaminates.

One problem with current e-beam evaporation facilities which attempt to evaporate alloys is that different parts of the evaporant pool have different composition due to temperature gradients in the evaporant pool. This results in nonuniform alloying ratios in the deposit. By entraining the evaporant in a turbulent directed gas flow, it is possible in the present process to mix the segregated vapor streams and create a uniform alloy deposit.

The evaporant in the present invention is generated by impinging the evaporant source with an e-beam such that the vaporized evaporant is given off and entrained in the carrier gas stream. The step of impinging the evaporant source with the e-beam can be performed, if desired, inside of the means for generating the carrier gas stream. Thus, the e-beam would enter into the carrier gas conducting assembly which would also have the evaporant source contained therein. Once the evaporant is formed it would then be entrained in the carrier gas stream prior to any nozzle, pass through such a nozzle and be directed to the substrate.

However, when creating the evaporant prior to a nozzle, it is necessary to avoid clogging the nozzle. The conventional JVD process almost certainly encounters problems with nozzle clogging when the evaporant is prepared inside the jet prior to the nozzle. While methods for preventing such nozzle clogging have been suggested, such as using up to 50% of hydrogen in the carrier gas stream, slower evaporation of the evaporant source and increased gas flow, such solutions also have undesirable effects on efficiency. The use of hydrogen in the carrier gas stream is unsuitable when using refractory materials such as titanium due to the formation of hydrides. Slower generation of the evaporant has obviously detrimental effects on the deposition rate. Increased gas flow wastes carrier gas sources and can cause an increase in the absolute level of impurities deposited on the substrate.

In order to generate the evaporant of the present invention inside of the carrier gas conduit, prior to the nozzle, it is preferred to use a gas conduit and nozzle assembly with a diameter of 2.5 cm or greater, as opposed to the conventional nozzles used having diameters less than 2 cm. This increase in conduit and nozzle diameter helps to prevent clogging and provides a wide carrier gas stream which can increase efficiency and deposition rate by covering more area per unit time. Note that in certain instances it may be desirable to use a gas conducting tube with no nozzle, i.e., a straight pipe.

While the carrier gas conduit can consist of a straight flow tube, it may be desirable to at least partially enclose the end of the flow tube with a type of nozzle, such as a converging, diverging or converging/diverging nozzle. In addition, such nozzles can be designed to allow for real-time change of the nozzle shape and/or dimensions. This flexibility increases the utility of the processing system of the present invention especially during multilaminate or continuous processing where optimal coating of the substrate with a given material can require differing flow conditions during the processing.

In a preferred embodiment of the present invention, the step of impinging the evaporant source with the e-beam is performed inside the deposition chamber, but external to the means for generating the carrier gas stream. By performing the process in this manner, the present system eliminates the need for modifying the carrier gas by inclusion of hydrogen. Further, this embodiment avoids the requirement of using a large diameter jet nozzle, although use of such a large diameter nozzle can still provide deposition rate improvements with this embodiment.

Evaporation via resistive heating may work well for low melting point materials such as aluminum and gold where the heating element (often tungsten) can supply the necessary heat energy for fairly rapid evaporation rates. However, resistive heating is wholly unsuitable for use with reactive, refractory materials such as titanium or molybdenum. In this case, evaporation rates are slow and contamination of the desired evaporant by the heating element proves to be a problem. In addition, failure of resistive heating elements limits the utility of such systems for continuous industrial production facilities. As explained below, the use of an electron beam gun as the heating source makes possible the rapid, efficient evaporation of any and all materials during long, continuous runs.

Finally, the operating characteristics of the new apparatus make it highly suitable for industrial-scale production purposes. The apparatus for performing the present process can be brought to a suitable pressure in less than 5 minutes, allowing for rapid changing of source, substrate, or other system components during maintenance or system reconfiguration shutdowns. Traditional e-beam systems require a substantially greater length of time to pump down into their operating pressure range of below $10^{-6}$ Torr.

The mean time between failures of the filament in the electron beam gun of the present invention is at least 10 hours when operating the gun constantly at full power (10 KW). This is far longer than the expected lifetime of the resistive heating elements used by current low vacuum evaporation facilities. In general resistive (contact) heating sources are not well suited to use in continuous processing systems. As is well known by operators of heating elements and light bulbs, contact of the heating/lighting source with any substance, especially reactive (e.g., oxidizing) agents, leads to rapid deterioration and failure of the source in many instances. Such failures necessitate frequent, time consuming maintenance using conventional resistive heating elements. Such a maintenance requirement is relieved by the present apparatus and process through the use of an electron generating filament in the high vacuum (clean) portion of the gun.

The unique and potentially revolutionary process of the present invention combines a directed gas flow process with electron beam heating to evaporate and deposit metal and ceramic vapors onto flat and fibrous substrates efficiently. The directed evaporation and deposition system of the present invention has proven that an electron beam gun source can vaporize metals in a vacuum chamber at low vacuums such as 5 Torr, or even up to atmospheric pressure, and the metal vapor created with this e-beam heating source can be successfully entrained in a directed flow of helium gas and deposited on glass slides, producing a wide range of products from thin shiny deposits to thicker, rough-surfaced metal films.

The process of the present invention has enormous potential as a solution for rapidly and economically producing conventional coated materials (e.g. TiN coated titanium) and new products such as high quality multilayered thermal barrier coatings, large area flat panel displays, high temperature superconductors, thin film photovoltaics, and multichip modules. Processing of advanced materials via this technique requires careful real-time monitoring and control of the evolving microstructure critical to the performance of the final product. This can be achieved by optimization of the process parameters to provide the desired material microstructure and product properties needed for the specific application.

In a further embodiment of the present invention, the apparatus is used to prepare nanometer particles by operation at conditions sufficient to provide a high concentration of evaporant in the gas jet. High concentrations of evaporant are generated by using low entraining gas flow velocity (extending down into the subsonic flow region) and high e-beam power (into the 3–10 or higher kw range). At these high evaporant concentrations, the probability of three body collisions increase and dimers, trimers and larger clusters of evaporant begin to grow. The growth of these cluster is readily controlled by further expansion of the gas jet, thus accelerating the gas flow velocity and reducing the opportunity for the evaporant to undergo further collisions.

The size of the nanometer particles is thus primarily controlled by manipulation of the evaporant concentration in the gas jet, the inert gas pressure and the flow geometry created near the melt surface. The nanometer particles can be prepared using any evaporant source, just as in the coating process described above. Further, oxides, hydrides, carbides and nitrides of the evaporant can be formed by the introduction of various reactant gases into the chamber, including, but not limited to, $O_2$, $H_2$, $CH_4$, and $NH_3$.

The nanometer particles thus produced range in mean particle size up to 100 nm, preferably from 5 to 100 nm. The particles are produced with a very narrow particle size distribution, preferably with 90% of the particles formed being within ±3 nm of the mean.

When the nanometer particles are produced, they can be collected in various ways. The particles can be obtained after they deposit on the walls of the deposition chamber or after depositing the particles onto the surface of a substrate. This differs from the above-described coating method in that in the production of nanometer powders, the particles are formed before they contact the substrate and thus do not form a thin coating on the substrate. Rather they deposit as discrete particles onto the substrate. However, these methods are not always preferred since they have a tendency to result in particle deformation once the particle is in contact with the chamber wall or substrate.

One preferred method for the collection of the particles includes entraining the particles in a non-reactive liquid substrate, such as silicone oil or freon. The particles can then be separated from the liquid using conventional liquid-solid separation techniques. Another preferred method for collecting the nanometer particles is by directing the gas jet containing the entrained nanometer particles into a cyclone separator. The cyclone then separates the solid particles from the gas to obtain the solid particles directly.

If the particles are formed from a highly reactive metal or alloy, they can be passivated, if desired, by the introduction of trace oxygen into the deposition chamber of the present apparatus. This passivation thus forms a thin monolayer of oxide on the surface of the highly reactive particles to protect them from further reaction with the atmosphere.

Nanometer particles, as produced by the present invention, can be used in the preparation of conductive adhesives and polymers, powder metallurgical products, wear-resistant materials, superconductors and high-temperature materials using conventional fabrication methods.

The directed vapor deposition system of the present invention incorporates a 60 KV/10 KW electron beam gun source into its fundamental design. The present electron beam gun electronic controller and power transformer were built based upon theoretical calculations concerning the generation of an e-beam in low vacuum and how far such an e-beam would travel under such conditions. From these calculations, the present apparatus was designed.

The major components of the directed vapor deposition system described herein are shown in the schematic assembly drawing of FIG. 1. The electron beam gun assembly is composed of three major components: the gun itself (30), the gun's power supply (40), and the gun's electronic control system (10). The power supply (40) is an electrical transformer which steps the voltage from the voltage available to the 60,000 V needed by the gun. The electronic control system (10) ensures proper gun operation by controlling the gun's beam focussing coils, monitoring the current flow through the cathode, anode, and nozzle, ensuring that the cross-valve between the high vacuum and differentially-pumped portions of the gun is open, and allowing the transformer to supply power when all safety checks have been satisfied. The electronic control system can be operated either manually or preferably using a computer.

Since this directed vapor deposition system is a vacuum process, it requires the use of vacuum pumping assemblies, such as a high vacuum turbomolecular pump (20) with a mechanical backing pump. This pumping package combination is capable of maintaining a vacuum greater than $9 \times 10^{-7}$ Torr in the electron beam generating portion of the gun when the system is not in operation and greater than $8 \times 10^{-5}$ Torr when it is in operation. The differential pumping package (50) ensures that the vast majority of the carrier gas from the deposition chamber (100) does not reach the beam generating space during processing by instead removing that gas to the outside atmosphere. The third pumping package (60) is attached to the deposition chamber (100) and is responsible for removing the carrier gas introduced to the system through the carrier gas stream generating means (70).

Once the three pumping packages are operational, the electron beam gun (30) can be turned on and a beam generated. This beam emerges from the gun column into the deposition chamber (100) and impinges upon the evaporant material source (80). Once heated, this source (80) emits a vapor stream which is captured by the carrier gas stream and carried towards the substrate (90) where most or all of the evaporant is deposited. All processing occurs inside the deposition chamber (100), preferably made of thick-walled stainless steel.

Figure 2:
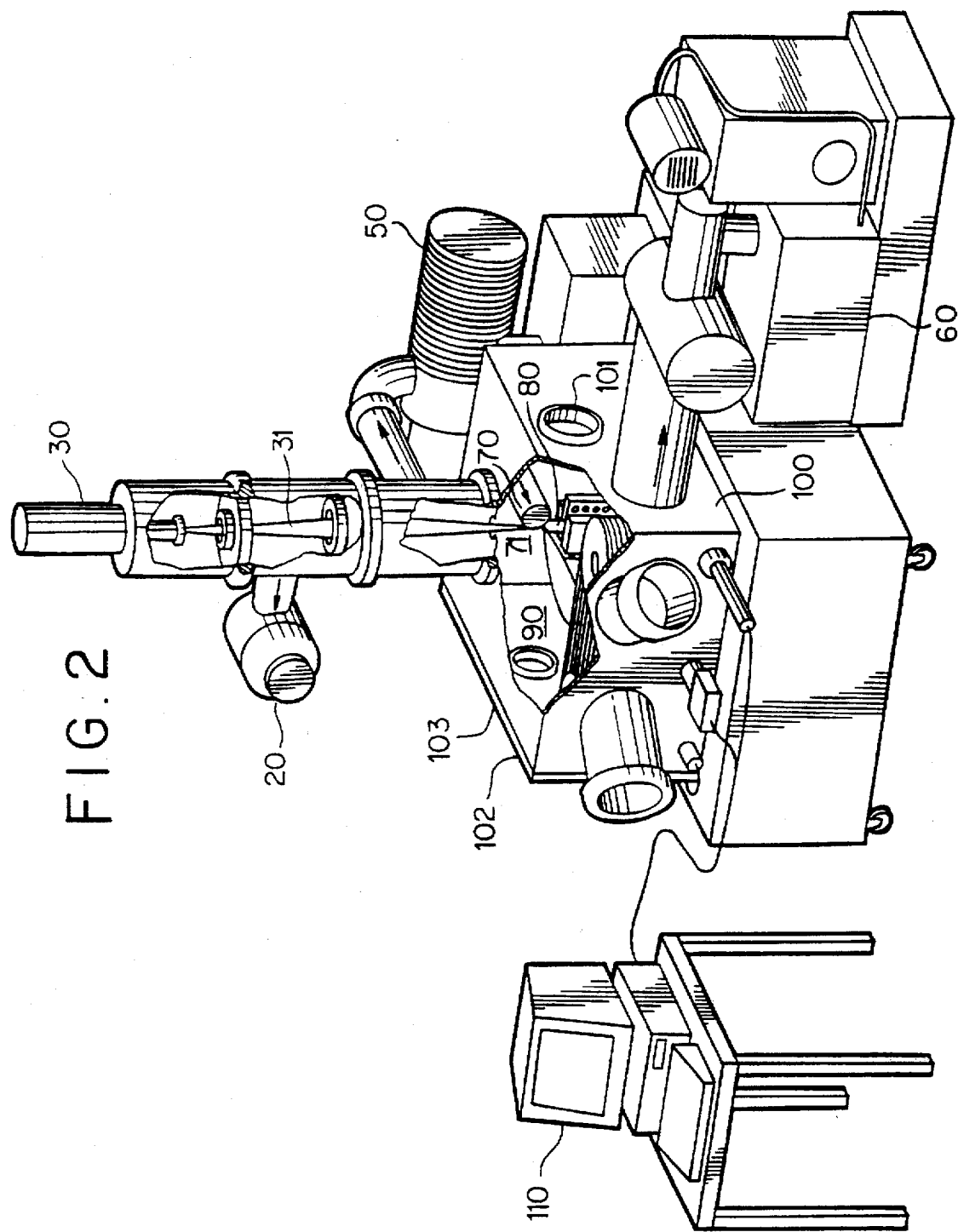
FIG. 2 shows a preferred embodiment of the apparatus used in the present process.

FIG. 2 provides a more detailed illustration of a preferred arrangement of the components of the directed vapor deposition system. In this embodiment the system is shown in operation with the beam (31) impinging upon the evaporant material source (80). Then the created vapor is transported by the carrier gas stream (71) to the substrate (90), in this instance an assembly of fibers.

The deposition chamber (100) is equipped with multiple sensing ports (101) necessary for closed-loop process control and optimization. Important in-situ sensing information obtained through sensing ports (101) includes temperature, pressure, deposit uniformity, growth rate, stress, microstructure, carrier gas flow characteristics (e.g., turbulent versus laminar, fast versus slow), and molten pool height data. As an example of the utility of such information it is noted that sensing of the size and shape of the molten pool can be used to determine the rate at which the source material should be fed into the carrier gas stream and/or chamber. Sensors used for all these measurements can include thermocouples, resistance temperature detectors (RTD's), FLIR cameras, assorted pressure gauges (e.g., cathode, thermocouple, diaphragm), optical sensors, laser induced fluorescence devices, ultrasonic sensors, eddy current sensors, microwave sensors, and x-ray diffractometers (XRD).

The deposition chamber (100) has an electron beam evaporant source (80) and the capability to incorporate other PVD and CVD sources or additional e-beam sources. The use of a box type deposition chamber makes possible the inclusion of door (102) which is the full size of one side of the deposition chamber (100). Door (102) provides quick and easy access to the entire interior of deposition chamber (100) for rapid changing of evaporant source (80), substrate (90), carrier gas stream generator (70), and other interior components such as heating lamps (not shown). The outside of the entire chamber (100) can be equipped with a water cooling conduit (not shown) which keeps the system's walls safely cooled while processing inside the system can occur at elevated substrate and gas temperatures. Additionally, because the entrained evaporant does not spread throughout the chamber as it does in traditional electron beam evaporation it is possible to equip deposition chamber (100) with large (5-15 cm diameter or larger) continuous viewing ports (103). Viewing ports (103) do not need to be shuttered to prevent coating and thus are available for continuous optical or laser sensing. These larger sensing/viewing ports (103) can be composed of a replaceable glass layer (to absorb what small amount of coating does occur) inside of a sealed quartz and/or lead-glass viewing port for vacuum integrity and x-ray protection.

The rate at which gas flows through the system can be regulated both upstream (before the carrier gas stream generator (70)) and downstream (outside the deposition chamber (100) but just before the chamber pumping system (60)). Upstream pressure control can be performed via a mass flow sensor, valve and controller while downstream pressure control can be performed via a throttle plate located in front of the chamber pumping package. The mass flow components regulate how much gas enters the system per unit time (i.e., standard liters per minute) while the throttle plate determines how rapidly the gas can be pumped out of the chamber. The mass flow components, the throttle plate, and the settling chamber make up the pressure level and pressure ratio control apparatus, central to determining whether flow is super- or subsonic. Additionally, the interior and exterior of the walls of deposition chamber (100) have been provided with threaded holes (not shown) which traverse only partially through the chamber wall, allowing process monitoring equipment, substrates, substrate heaters, source monitors, etc., to be mounted either inside or outside the chamber. Finally, a computer (110) is coupled to the apparatus which is used for data acquisition and control.

While the preferred embodiment depicted in FIG. 2, shows the e-gun mounted in-line with the evaporant source, this need not be the case. As is well known to those skilled in the e-gun art, the e-beam generated can be easily redirected after emerging from the gun. This allows the added flexibility of mounting the gun in any orientation so long as the e-beam impinges upon the evaporant source material generally from above. This ensures that the molten pool formed by e-beam heating does not drip or slide off the top of the source material.

In the present system, the electron beam propagates through a tube containing a partial pressure of helium (from $10^{-6}$ Torr in the beam generating space to $10^{-2}$ Torr in the differentially pumped lower portion of the gun) and can evaporate the source material from either a cooled wire, water cooled copper crucible feed system, or contactless, cold crucible. By attaching this heating source to a vacuum chamber (containing a partial pressure of 1 millitorr to 5 Torr of helium), a metal vapor can be created beyond the exit of the helium gas flow tube, entrained within that flow, and directed onto a substrate.

A number of variables can be manipulated in performing the process of the present invention. These variables include vapor entrainment rate, evaporation and deposition rates, gas flow velocity from the carrier gas jet, chamber pressure, bias voltage (polarity) rate of bias voltage modulation, and substrate temperature.

The evaporation rate, ER, and deposition rate, DR, combine to give the efficiency, $E_{ff}$, of the process in accordance with the following formula:

$$\frac{DR}{ER} \times 100\% = E_{ff}$$

The following Table 1 provides the evaporation rates possible for a variety of elements using an e-gun operating at 10 KW power.

Beam Methods," Vol. 1, Ed. Giacinto Scoles, Oxford University Press, pp. 14–15 (1988). In particular, the gas flow velocity will reach sonic levels of Mach 1 or greater when $P_o/P_b > 2.1$ for all gases. In the process of the present invention it is preferable to maintain a gas flow velocity wherein $P_o/P_b$ is from 1 to 1000, preferably 1.2 to 10, most preferably at the sonic/subsonic border of $P_o/P_b \approx 2.1$. For the formation of nanometer particles in an alternative embodiment of the present invention, the gas flow velocity is maintained at a subsonic range, such that $P_o/P_b < 2.1$.

In the process of the present invention the deposition chamber is maintained at a pressure from 0.001 Torr to atmospheric pressure. Preferably the deposition chamber is maintained at a low vacuum of from 0.01 to 100 Torr, most preferably 0.1 to 10 Torr.

The substrate used in the present invention can be maintained at any temperature suitable for effecting deposition, such as from −196° C. to 1500° C. preferably 0 to 900° C. most preferably 400° C. to 700° C. Of course the temperature chosen depends on the nature of the substrate since the substrate must be physically and thermally stable during deposition. Thus it is necessary to avoid temperatures which cause permanent embrittlement for a given substrate and avoid temperatures at which the substrate thermally decomposes. Despite these requirements, it is conceivable to deposit onto materials that have high vapor pressures, e.g. liquids.

The system employs a differentially pumped gun column to generate an electron beam in a $10^{-6}$ Torr pressure zone (22,200 l/min @ $10^{-5}$ Torr) double flow standard turbomolecular vacuum system. Once created, the electron beam is transmitted with minimal energy loss down the gun column into a $10^{-2}$ Torr pressure region evacuated by a second vacuum system operating at much lower vacuum such as an Edwards Model EH500 (8500 l/min @ $10^{-2}$ Torr) mechanical booster pumping package. Finally, the beam emerges into the deposition chamber through a hole in a replaceable plug, made of a metal, metal alloy or other elemental material which has a melting point high enough to avoid melting caused by impingement of a portion of the collimated e-beam on the plug. This ensures that frequent replacement of the plug is not necessary. Suitable materials for the plug have melting points above approximately 2000° C. and include metals and alloys such as tungsten, molybdenum, tungsten/zirconium/molybdenum (TZM), niobium, nickel alloys, nickel superalloys, stainless steels, zirconium, hafnium and hafnium carbides and elemental materials such as carbon. The plug is most preferably made of tungsten. The replaceable plug separates the gun column from the process chamber and holds the deposition chamber at the desired operating pressure using a low vacuum system such as a Stokes Model 1722 (30,000 l/min @ 1 Torr) blower package.

TABLE 1

| | Elements | | | | | | | | | |
|---|---|---|---|---|---|---|---|---|---|---|
| | Al | B | C | Mo | Ni | Nb | Ti | V | Zr | Y |
| mole/sec | 2.69 | 0.016 | 0.010 | 0.014 | 0.02 | 0.015 | 0.018 | 0.018 | 0.015 | 0.020 |
| cm³/min | 1605 | 4.35 | 3.3 | 7.65 | 9.9 | 7.95 | 11.55 | 11.7 | 12.6 | 23.6 |
| g/min | 4333.5 | 10.18 | 7.45 | 78.18 | 88.1 | 68.1 | 52.4 | 71.5 | 82.0 | 105.3 |

The gas flow velocity of the carrier gas jet is manipulated by the use of a pressure differential from the upstream pressure $P_o$ in the jet, to the background or deposition chamber pressure $P_b$, as described in "Atomic and Molecular As the beam propagates down the gun column it is focused electromagnetically into an intense e-beam having sufficient energy and diameter to penetrate through the partial pressure of the system to the evaporant source. The directed carrier gas must be a gas which allows penetration of the electron beam from the gun to the source material and is preferably He or a mixture of He and one or more gases selected from $O_2$, $N_2$, hydrocarbons, silanes, and other non-He inert gases. Suitable hydrocarbon gases include methane and acetylene. It is also possible to utilize all the traditional CVD precursors and use the e-beam to decompose them.

Figure 3:
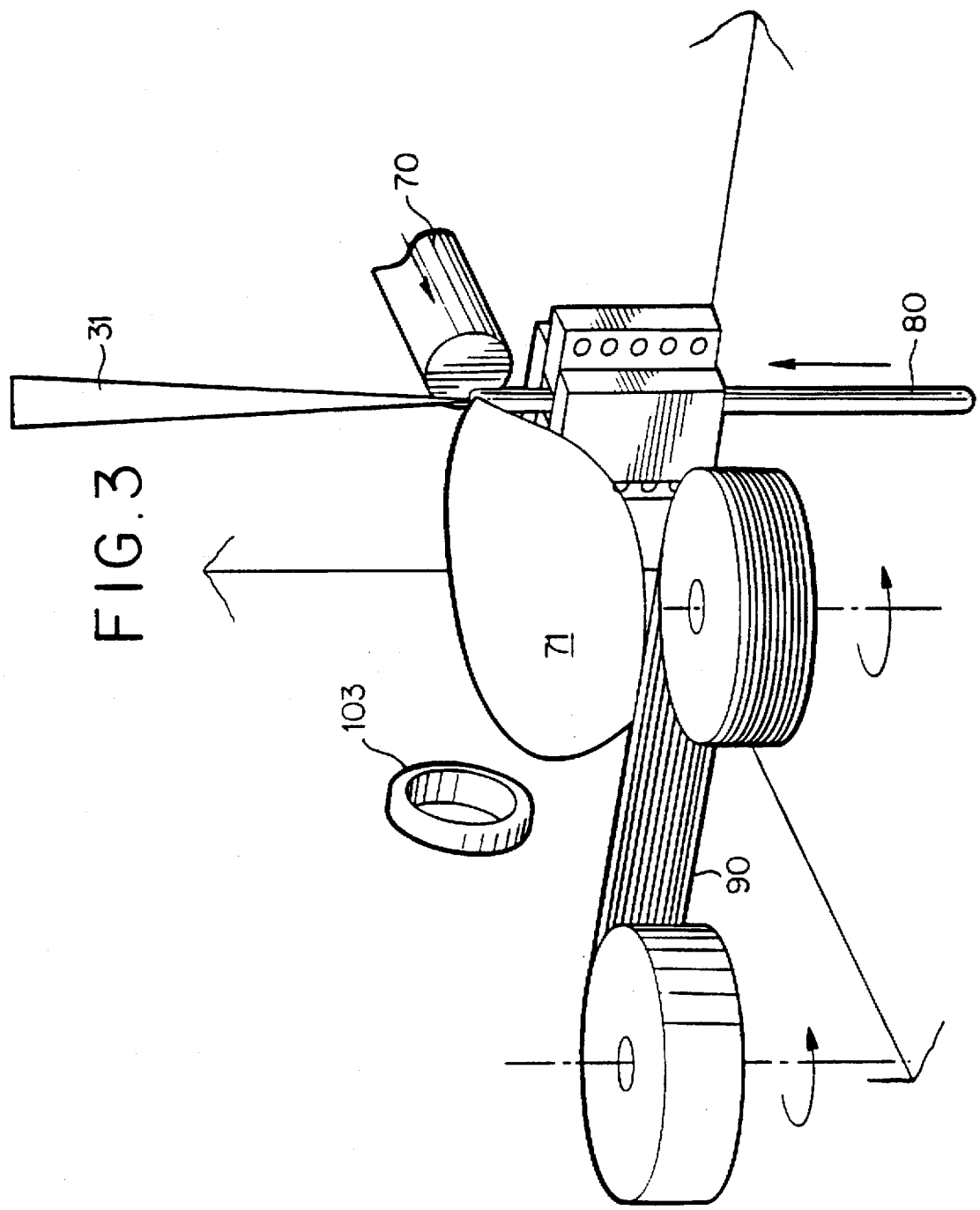
FIG. 3 shows a cutaway view inside the deposition chamber of the apparatus of the present invention.

FIG. 3 shows a cutaway view inside the processing chamber of the present system. In this figure, the specific interaction between the electron beam (31), evaporant source (80), and carrier gas (71) can be observed. The vapor so produced and entrained can then be deposited onto the substrate (90), in this case onto an array of fibers. It is also possible from this figure to observe the location of one of the large continuous viewing ports (103). Such a port makes possible in-situ sensing (of the gas flow, electron beam (31), and evaporant source (80)) vital for optimal system operation. Obviously, when the apparatus is used to prepare nanometer particles, instead of coating a substrate, no substrate is used, if the particles are collected by directing the gas flow into a cyclone separator, or if a substrate is used, the substrate is preferably a liquid substrate from which the nanometer particles can be readily separated.

The evaporant source is located in line with the e-beam and is sufficiently close to the e-gun to allow penetration of the e-beam from the gun, through the carrier gas, to impinge on the evaporant source. This distance is dependant on such factors as the e-beam energy and the density of the carrier gas. The evaporant source is located 0.5 cm to 8 m from the bottom of the e-gun column, preferably 1 to 20 cm, most preferably 1 to 5 cm. When the evaporant source is located at a distance of greater than 30 cm, then it is preferred to use magnetic fields at various locations along the length of the beam to maintain the beam's focus. Such magnetic fields may be generated by toroidal electro-magnets or other electromagnetic means.

The intense e-beam preferably has an energy of up to 170 mA for a 10 KW system or correspondingly higher for higher power (wattage) e-guns. The focused beam diameter at the evaporant source is preferably 0.4 mm to 10 cm, more preferably 0.4 mm to 2 cm, most preferably 1 cm. In order to provide beam diameters of greater than about 1 mm, a magnetic defocussing means can be used. Suitable magnetic defocussing means include a toroidal electromagnet having a field which operates to decollimate the beam just prior to impingement on the evaporant source allowing evaporation of the source at higher rates and avoiding localized overheating of the source.

As an alternative embodiment, the e-beam can be rastered to provide distributed heating of the evaporant source. Such e-beam rastering is preferably performed by use of electromagnetic deflection of the e-beam using conventional deflection coils and conventional rastering patterns. It is also possible to keep the e-beam stationary and raster/rotate the evaporant source material instead.

Given the sharp focus of the electron beam and the short propagation distance to the source feed material in the preferred embodiment, efficient heating and evaporation of any desired feed stock from a wire feed mechanism, water-cooled rod-fed crucible, or contactless, cold crucible is possible in gettered He partial pressures of up to atmospheric pressure preferably and most preferably at pressures of up to 5 Torr.

The gas pressure in the various portions of the system can be precisely measured by an array of vacuum gauges, preferably computer monitored vacuum gauges. While the pressure in the beam generating space is measured by a Penning gauge (also called a hot or cold cathode gauge) and a Pirani gauge (also called a thermocouple gauge), the pressure in the differentially pumped lower portion of the gun is measured by a single Pirani gauge. The pressure in the main processing chamber, helium inlet tube, and gas settling chamber is measured by separate conventional capacitance manometer gauges each of which utilizes a gas-deformable membrane to gauge pressure independent of gas composition. This type of highly accurate, gas independent gauging is valuable given the various gas mixing regimes which can be utilized to produce products such as metal/ceramic functionally graded composites. The pressure measurements from these gauges are used as input to a conventional mass flow controller and valve system, such as an MKS Model 647B mass flow controller and valve system. This computer-controlled flow monitoring system uses the pressure readouts from the vacuum gauges as input for determining the desired gas flow rate. The gas flow system can precisely mix multiple gases, preferably up to eight different gas sources, allowing vast flexibility when choosing reactive mixtures for deposits. For the most efficient evaporation from a crucible source, either an electromagnetic deflection system can be used to deflect the electron beam and distribute the beam's power over the surface of the (0.5–20 cm diameter) rod stock or a toroidal electromagnetic defocussing system can be used to spread out the beam's power once it passes through the necessary constriction (2.5 mm diameter hole) at the bottom of the gun column, as previously described. Such a deflection system will ensure that the source material leaves the rod stock as an atomistic vapor rather than as large droplets of molten material as the beam power is increased. In the present system, metal vapor entrainment occurs outside the gas conducting tube, through which ultrapure carrier gas (preferably>99.9995% pure), such as gettered helium or other carrier gasses, can flow, eliminating any problems associated with nozzle clogging. In addition, the substrates can be heated to temperatures of 600° C. and above via a computer controlled quartz heating lamp and resistance temperature detector (RTD) temperature sensing system. The ability to control the temperature of the depositing species precisely allows exploration of the structure and properties of the deposit. The combination of focused electron beam evaporation, focused gas entrainment of the evaporated species, and substrate heating represents a new materials processing path with unrivaled potential for the efficient high speed production of new or previously difficult to make material systems.

The process of the present invention can be used to coat any substrate suitable for use in vapor deposition processes. The process can thus be used to provide fibers for high performance metal matrix composites and to prepare multilayered materials with functionally graded properties. Various (e.g. ultrasonic, microwave, eddy current, XRD) in-situ sensor methods can also be used for characterizing deposit uniformity, growth rate, microstructure, and other important properties during each of the deposition processes.

In an alternative embodiment, ion-assisted directed vapor deposition (IADVD) can be performed using the process of the present invention by placing an electrostatic bias voltage on the substrate or behind the substrate, relative to the incoming evaporant/carrier gas stream. Since the evaporant contains ions and due to its interaction with the e-beam, this electrostatic bias provides further fine control of microstructure and characteristics of the coating by allowing the energy of the carrier gas entrained evaporant to be modulated just prior to impinging on the substrate. Depending on the bias (either negative or positive) the energy of the evaporant/carrier gas stream can be decreased or increased. By increasing the energy of the evaporant/carrier gas stream, the ions impinging the substrate then have sufficient additional energy to allow atomic rearrangement of the coating. This atomic rearrangement assists the formation of crystalline coatings.

The bias voltage for use in the IADVD embodiment ranges from unbiased (0 KeV) to a bias of 10 KeV, either positive or negative. Of course, in order to apply a bias to the substrate, the substrate must be capable of sustaining an electrical bias. Alternatively, a biasing means can be provided which is located behind the substrate relative to the side which is impinged by the evaporant/carrier gas stream. Suitable biasing means would include metallic plates or other conducting or semiconducting objects which are capable of sustaining an electrostatic bias.

The bias can be applied either continuously or can be modulated, if desired.

The process of the present invention can be performed either in a batchwise, semicontinuous or continuous manner. In performing a batch process, the substrate is placed into the deposition chamber, the apparatus sealed and evacuated to the desired operating pressure. The e-beam and directed carrier gas stream are then activated to begin the deposition process.

Figure 4:
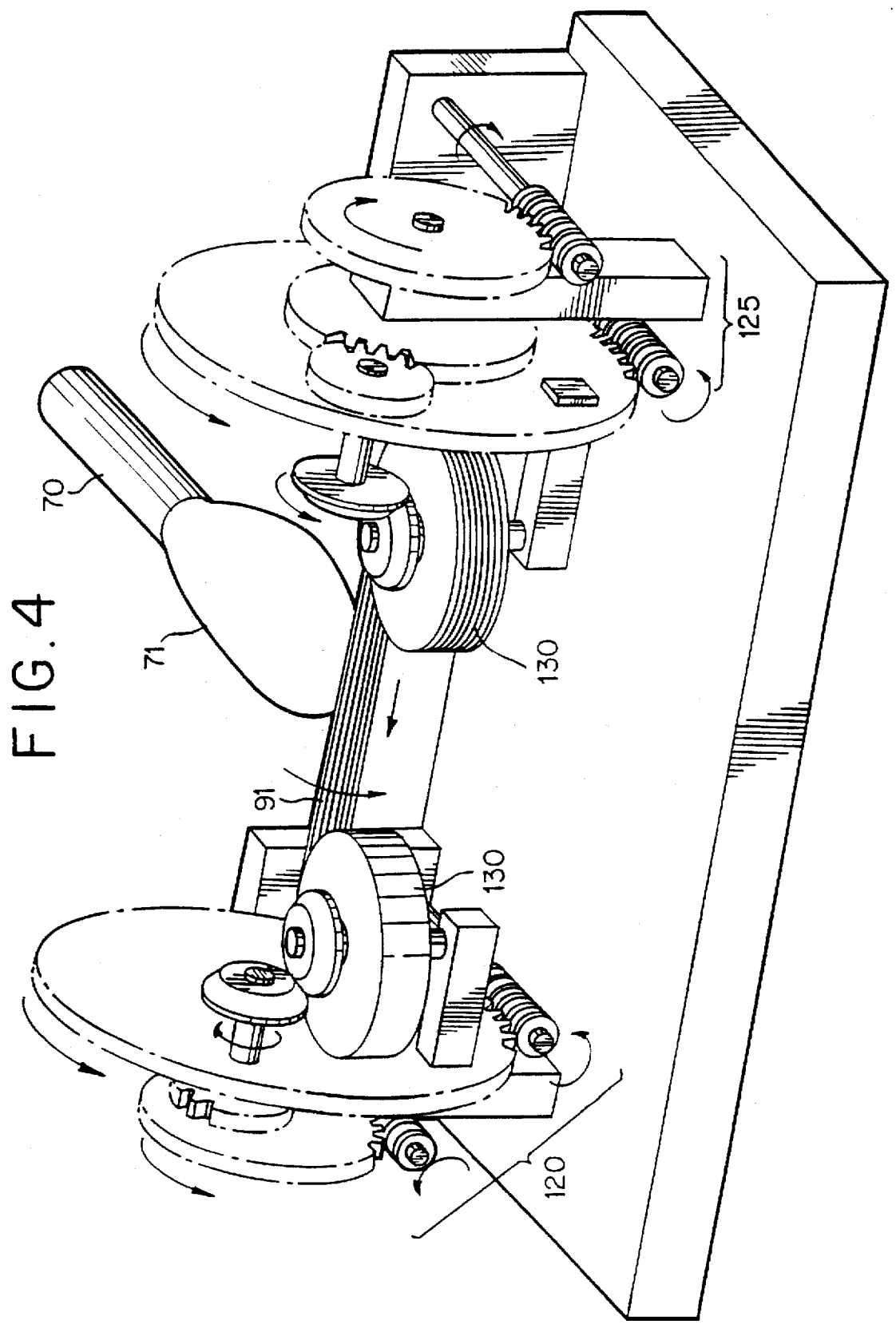
FIG. 4 shows an apparatus for fiber manipulation in the deposition chamber of the present process.

In the semicontinuous embodiment, a substrate is needed which can be moved through the carrier gas/evaporant stream. This embodiment preferably relates to the coating of substrates which can be rolled onto a spool, such as thin metal strips or fibers. FIG. 4 shows one preferred embodiment of the system in which the entrained evaporant source material is deposited onto an array of fibers (91) which are translated and rotated in front of the vapor stream (71), allowing for semicontinuous processing. The gearing mechanisms (120 and 125) to the left and right, respectively, of the vapor stream are coupled together so that both sets of gears turn in unison. This arrangement allows the fibers (91) to be pulled back and forth in front of the vapor stream (71). This ability to move back and forth is important when depositing multilayered coatings. It is possible to translate all of the fibers (91) on the spools (130) in front of the vapor stream (71) and coat them before changing evaporant sources and drawing the fibers (91) back in front of the vapor stream (71). This process can be repeated until all desired layers have been deposited. To ensure uniform coating around each fiber, the entire fiber manipulation gearing mechanism can rotate about an axis along which the center fiber runs. This arrangement ensures that the fibers remain in the vapor stream at all times while being coated symmetrically.

Figure 5A:
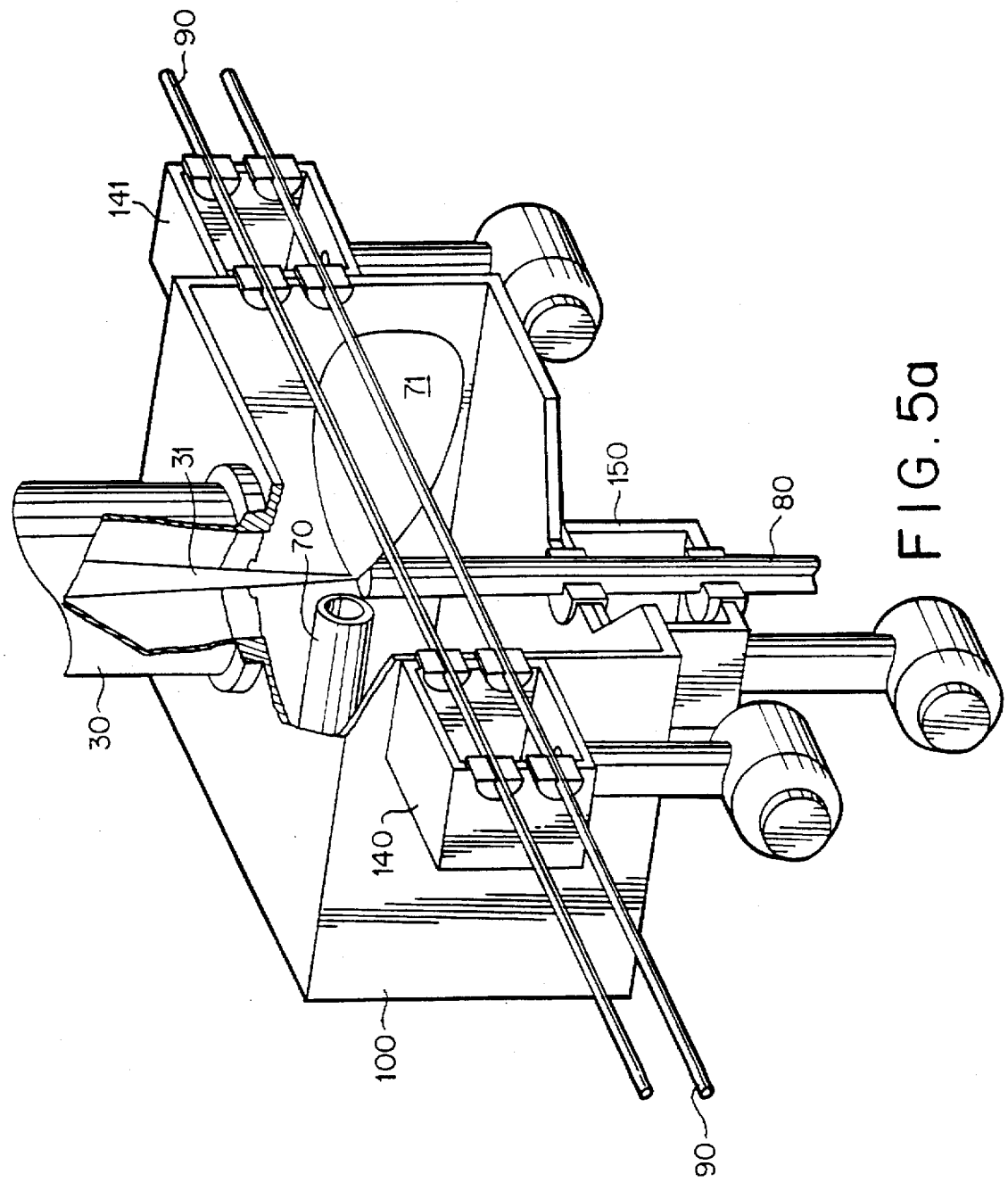
FIG. 5a is a schematic representation of an apparatus for performing the process of the present invention continuously.
Figure 5B:
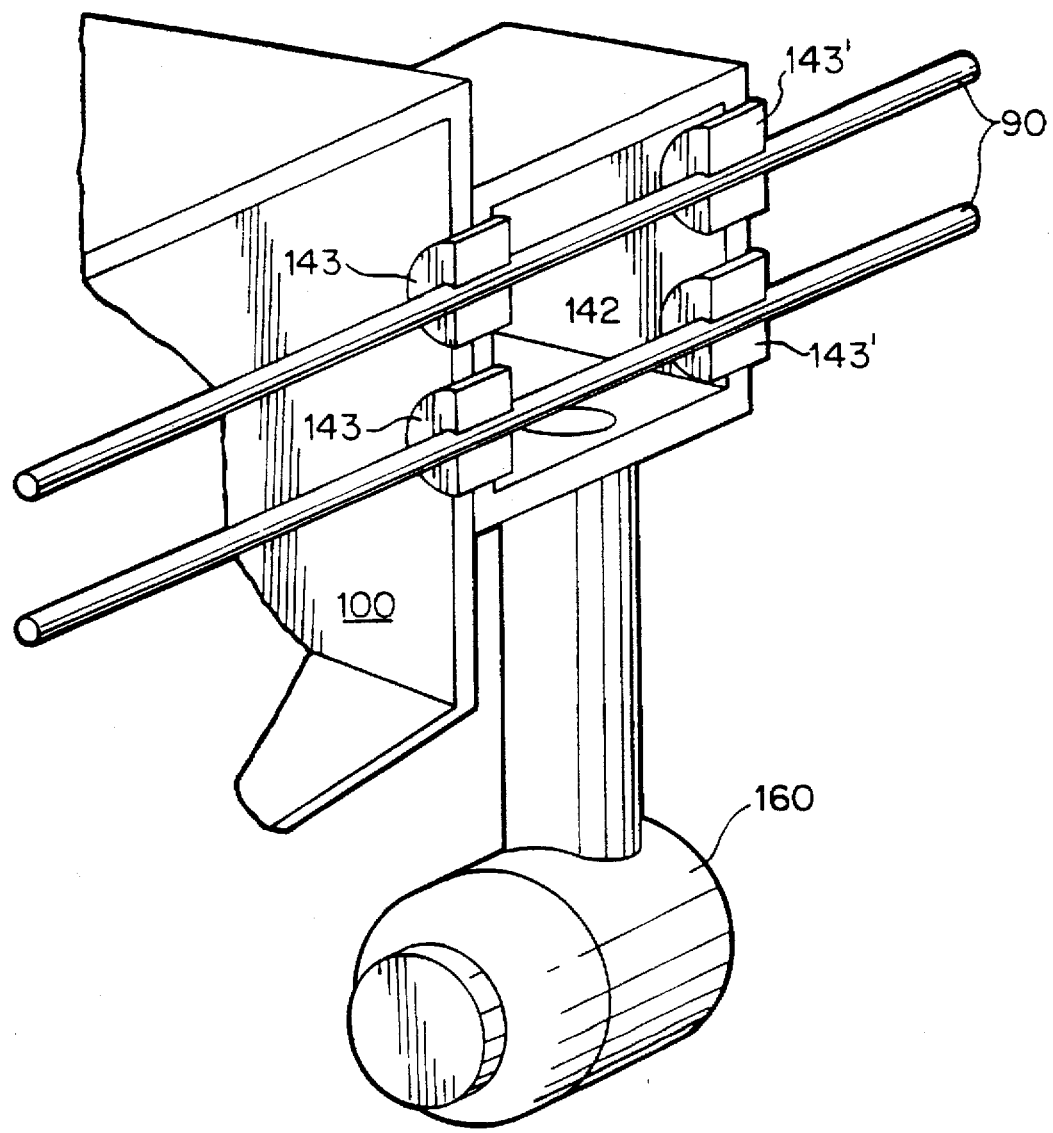
FIG. 5b is a schematic representation of a pressure decoupling chamber for use in the practice of the present continuous process.

The process of the present invention can also be performed continuously as shown in FIG. 5a by introducing a substrate (90) continuously through a pressure decoupled substrate entry port (140), passing the substrate through the carrier gas stream (71) and transporting the coated substrate (90) from the deposition chamber (100) through a pressure decoupled substrate exit port (141). The evaporant source can likewise be fed either as a continuous rod through a pressure decoupled evaporant source port (150) or be pumped into a crucible when the evaporant source is a liquid (not shown). The pressure decoupled substrate entry port (140), pressure decoupled substrate exit port (141) and pressure decoupled evaporant source port (150) use differential pumping to provide a stable vacuum within the deposition chamber (100). FIG. 5b provides a schematic representation of a pressure decoupled port suitable for use as either the pressure decoupled substrate entry port (140), pressure decoupled substrate exit port (141), or pressure decoupled evaporant source port (150), described above. The port of this embodiment uses a pressure decoupling chamber (142) which is connected to the deposition chamber by way of passages (143). Passages (143) must be of a size sufficient for the substrate (90) or evaporant source (now shown) to pass through. Since passages (143) are not sealed airtight, even when the substrate or evaporant source are inserted, they also allow for the entrainment of gas from one chamber to another. In order to maintain a stable vacuum on the deposition chamber (100), which operates at pressures of from 0.001 Torr to atmospheric pressure, the pressure decoupling chamber (142) must be operated at a pressure below that of deposition chamber (100) and sufficient to provide flow of gases from deposition chamber (100) to pressure decoupling chamber (142). Likewise, the gases from the atmosphere enter decoupling chamber (142) around the sample or evaporant source through passages (143') through which the sample or evaporant source is introduced into (or extracted from) pressure decoupling chamber (142). The pressure in pressure decoupling chamber (142) is preferably maintained at a value which is at least one order of magnitude lower than the pressure of deposition chamber (100) using pump (160). In order for the present process to be truly continuous, deposition chamber (100) must have a pressure decoupled substrate entry port (140), a pressure decoupled substrate exit port (141) and a pressure decoupled evaporant source port (150).

Once again, the process described above can be readily modified to provide production of nanometer particles of the evaporant in a batchwise, semicontinuous or continuous manner.

While the process and apparatus of the present invention is most simply operated with a single evaporant source, the vacuum chamber inside of which processing occurs can have additional evaporant source introduction ports. Further, additional e-beam sources or other vapor-deposition sources (e.g., CVD, resistively heated) can be fitted onto the chamber to expand the flexibility of the system. Such additional material inlets could alternate deposition with the e-beam source for multilaminate production or could be used in concert with it to deposit alloy composed of element with vastly different vapor pressures. The use of multiple evaporant sources can also be used to provide nanometer particles prepared from precisely controlled alloy compositions.

The system in operation has basic computer accessible process control equipment attached for temperature and pressure measurement and control. Additional in-situ facilities can be incorporated into the chamber and coupled with advanced computer control systems to ensure an optimal final product microstructure central to high quality product performance. Obviously numerous modifications and variations of the present invention are possible in light of the above teachings. It is therefore to be understood that within the scope of the appended claims, the invention may be practical otherwise than as specifically described.

What is claimed as and desired to be secured by letters patent of the United States is:

1. A process for the preparation of nanometer powders comprising: providing a deposition chamber, wherein said deposition chamber has an operating pressure of from 0.001 Torr to atmospheric pressure and has coupled thereto a means for providing a carrier gas steam and a means for providing an electron beam at said operating pressure and further contains an evaporant source;

impinging said evaporant source with said electron beam to generated said evaporant;

entraining said evaporant in said carrier gas stream in an amount sufficient to cause growth, in said carrier gas steam, of nanometer particles of the evaporant; and collecting said nanometer particles in a collection means selected from the group consisting of a cyclone separator and a non-reactive liquid substrate.

2. The process for vapor deposition as claimed in claim 1, wherein said impinging step occurs within said deposition chamber and externally to said means for providing a carrier gas stream.

3. The process for vapor deposition as claimed in claim 1, wherein said electron beam traverses said carrier gas stream prior to impinging said evaporant source.

4. The process for vapor deposition as claimed in claim 1, wherein at least a portion of said evaporant source is located within said carrier gas stream.

5. The process for vapor deposition as claimed in claim 1, wherein said evaporant source is entirely outside of said carrier gas stream.

6. The process as claimed in claim 1, wherein said evaporant source is a material selected from the group consisting of elemental materials and mixtures thereof.

7. The process of claim 1, wherein said evaporant source is a free standing solid material.

8. The process of claim 1, wherein said evaporant source is contained in a crucible.

9. The process of claim 8, wherein said crucible is a water cooled crucible.

10. The process of claim 9, wherein said evaporant source is in the form of a rod and said water cooled crucible is a continuously rod-fed, water cooled crucible.

11. The process of claim 1, wherein said evaporant source is held in place by an electromagnetic levitation means.

12. The process of claim 11, wherein said electromagnetic levitation means is a contactless crucible.

13. The process of claim 1, wherein said evaporant source is in a form selected from the group consisting of a liquid, a powder, a rod, or a solid mass.

14. The process of claim 1, wherein said evaporant source is continuously fed into the deposition chamber through an evaporant source port, wherein said evaporant source port provides a passage from outside said deposition chamber into said deposition chamber.

15. The process of claim 1, wherein said electron beam is applied to said evaporant source at a position on said evaporant source which is varied by an electromagnetic rastering means.

16. The process of claim 1, wherein said electron beam is defocused after exiting said means for providing an electron beam and prior to impingement on said evaporant source.

17. The process of claim 1, wherein said carrier gas stream comprises an inert gas or a mixture of an inert gas with one or more reactive gases.

18. The process of claim 17, wherein said carrier gas stream has a purity of >99.9995% for each individual gas.

19. The process of claim 16, wherein said electron beam is defocused by an electromagnet.

20. The process of claim 18, wherein said carrier gas stream comprises He.

21. The process of claim 20, wherein said carrier gas stream further comprises one or more gases selected from the group consisting of $O_2$, $N_2$, hydrocarbons, silanes, and inert gases other than He.

22. The process of claim 18, wherein said carrier gas stream consists of He.

23. The process of claim 1, wherein said nanometer particles have a mean particle size of from 5 to 100 nm.

24. The process of claim 23, wherein at least 90% of said particles have a particles size within ±3 nm of said mean particle size.

25. The process of claim 1, wherein said nanometer particles are collected by entraining said particles in a non-reactive liquid substrate present in said deposition chamber and separating said particles from said non-reactive liquid substrate.

26. The process of claim 1, wherein said nanometer particles are collected by directing said carrier gas stream containing said nanometer particles into a cyclone separator and separating said particles from said carrier gas stream.

27. The process of claim 1, wherein said carrier gas stream is operated at a flow velocity of $P_c/P_b<2.1$.

28. The process of claim 1, wherein said operating pressure is from 1 Torr to atmospheric pressure.

29. The process of claim 1, wherein said electron beam is applied to said evaporant source at a position on said evaporant source which is varied by laterally moving said evaporant source in relation to said electron beam.

30. An apparatus for preparing nanometer powders, comprising:

a deposition chamber;

an electron beam gun coupled to said deposition chamber, wherein said electron beam gun is capable of providing an electron beam in said deposition chamber when said deposition chamber is maintained at an operating pressure of 0.001 Torr to atmospheric pressure;

a means for generating a carrier gas stream, wherein said means for generating a carrier gas stream is located such that said electron beam passes through at least a portion of said carrier gas stream prior to impinging on an evaporant source; and a collection means for collecting the nanometer powder produced, by directing said carrier gas stream into said collection means, wherein said collection means is selected from the group consisting of a cyclone separator and a non-reactive liquid substrate.

* * * * *